(12) United States Patent  
Mizushima et al.

(10) Patent No.: US 8,114,755 B2  
(45) Date of Patent: Feb. 14, 2012

(54) METHOD OF MANUFACTURING SEMICONDUCTOR DEVICE

(75) Inventors: Ichiro Mizushima, Yokohama (JP); Yoshio Ozawa, Yokohama (JP); Takashi Nakao, Yokohama (JP); Akihito Yamamoto, Naka-gun (JP); Takashi Suzuki, Yokohama (JP); Masahiro Kiyotoshi, Sagamihara (JP); Minako Inukai, Yokohama (JP); Kaori Umezawa, Kamakura (JP); Hiroaki Yamada, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 190 days.

(21) Appl. No.: 12/146,143

(22) Filed: Jun. 25, 2008

(65) Prior Publication Data

US 2009/0011570 A1    Jan. 8, 2009

(30) Foreign Application Priority Data

Jun. 26, 2007  (JP) ................................. 2007-167998

(51) Int. Cl.  
*H01L 21/76* (2006.01)

(52) U.S. Cl. ... 438/416; 438/424; 438/429; 257/E21.09; 257/E21.092

(58) Field of Classification Search .................. 438/416, 438/424, 429, 311; 257/E21.09, E21.092, 257/347, E21.32, E21.561  
See application file for complete search history.

(56) References Cited

U.S. PATENT DOCUMENTS

| | | | |
|---|---|---|---|
| 5,891,763 A * | 4/1999 | Wanlass | 438/149 |
| 6,448,115 B1 * | 9/2002 | Bae | 438/151 |
| 6,537,894 B2 * | 3/2003 | Skotnicki et al. | 438/424 |
| 7,015,147 B2 | 3/2006 | Lee et al. | |
| 7,019,364 B1 * | 3/2006 | Sato et al. | 257/347 |
| 7,495,287 B2 * | 2/2009 | Oka et al. | 257/347 |
| 7,504,301 B2 * | 3/2009 | Waite et al. | 438/255 |
| 7,883,969 B2 * | 2/2011 | Oh et al. | 438/270 |
| 2002/0081821 A1 * | 6/2002 | Cabuz et al. | 438/455 |
| 2003/0146488 A1 * | 8/2003 | Nagano et al. | 257/506 |
| 2005/0098094 A1 * | 5/2005 | Oh et al. | 117/95 |
| 2005/0176222 A1 * | 8/2005 | Ogura | 438/514 |
| 2006/0091426 A1 * | 5/2006 | Hara | 257/211 |
| 2007/0102749 A1 | 5/2007 | Shirota et al. | |
| 2008/0073635 A1 | 3/2008 | Kiyotoshi et al. | |
| 2008/0157092 A1 | 7/2008 | Arai et al. | |

FOREIGN PATENT DOCUMENTS

| | | |
|---|---|---|
| JP | 2005-045258 | 2/2005 |
| JP | 2006-100322 | 4/2006 |
| JP | 2008-186827 | 8/2008 |

OTHER PUBLICATIONS

Ozawa et al.; "Semiconductor Device and Method for Manufacturing the Same", U.S. Appl. No. 12/040,224, filed Feb. 29, 2008. A Notice of Reasons for Rejection mailed by the Japanese Patent Office on Oct. 6, 2009, for Japanese Application No. 2007-167998, with English translation.

* cited by examiner

*Primary Examiner* — Khiem D Nguyen  
(74) *Attorney, Agent, or Firm* — Finnegan, Henderson, Farabow, Garrett & Dunner, L.L.P.

(57) ABSTRACT

A method of manufacturing a semiconductor device includes removing a part of a semiconductor substrate to form a protruding portion and a recess portion in a surface area of the semiconductor substrate, forming a first epitaxial semiconductor layer in the recess portion, forming a second epitaxial semiconductor layer on the protruding portion and the first epitaxial semiconductor layer, removing a first part of the second epitaxial semiconductor layer with a second part of the second epitaxial semiconductor layer left to expose a part of the first epitaxial semiconductor layer, and etching the first epitaxial semiconductor layer from the exposed part of the first epitaxial semiconductor layer to form a cavity under the second part of the second epitaxial semiconductor layer.

20 Claims, 20 Drawing Sheets

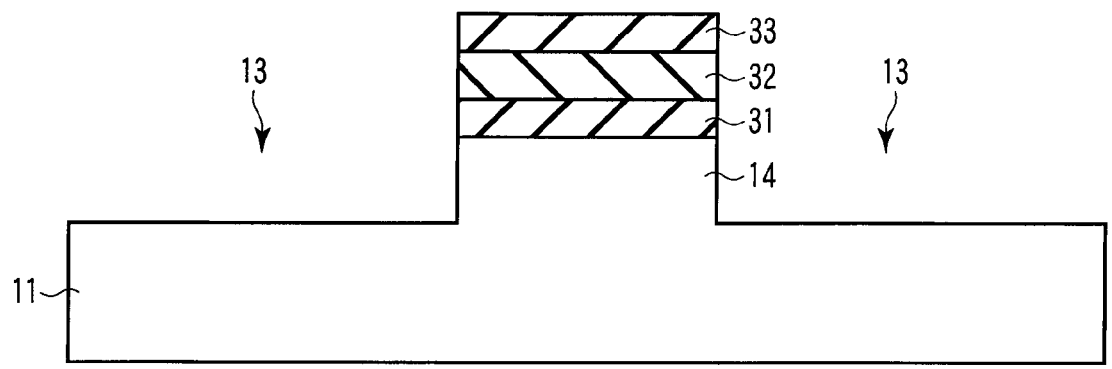
F I G. 16
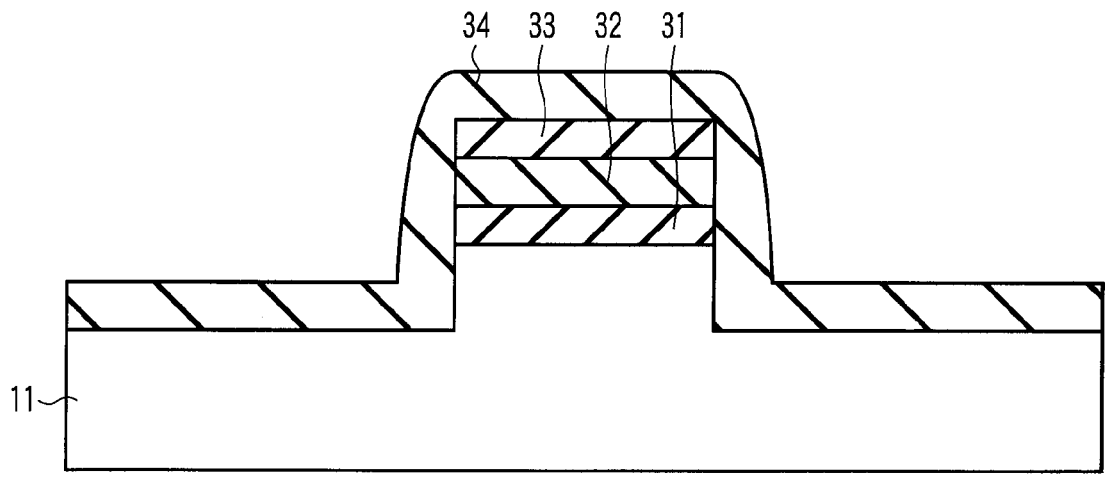
F I G. 17
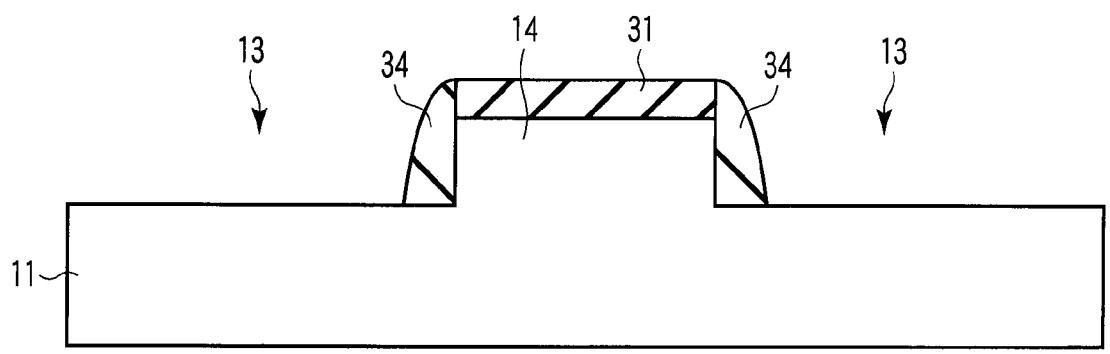
F I G. 18

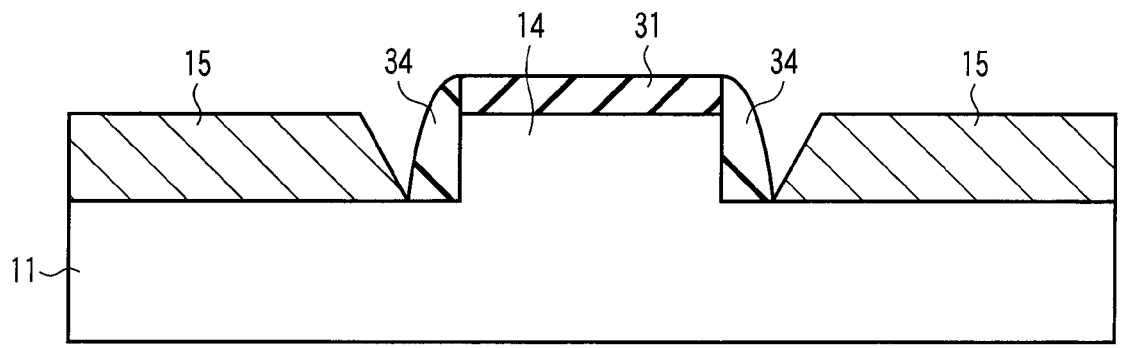
F I G. 19
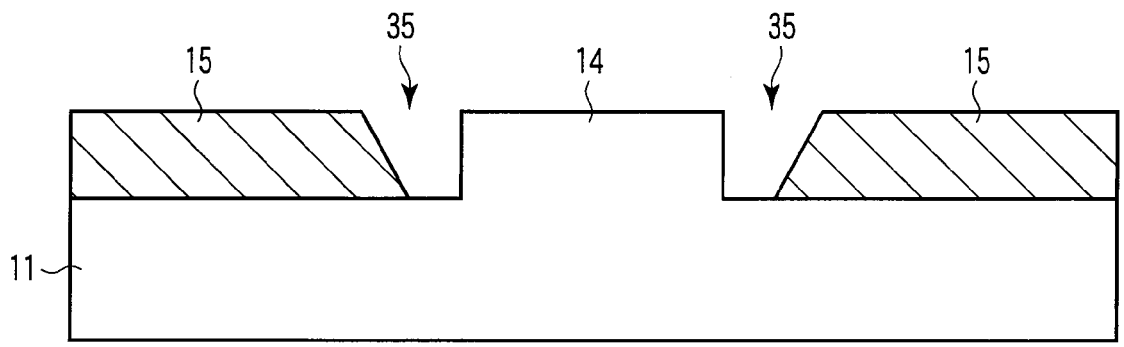
F I G. 20
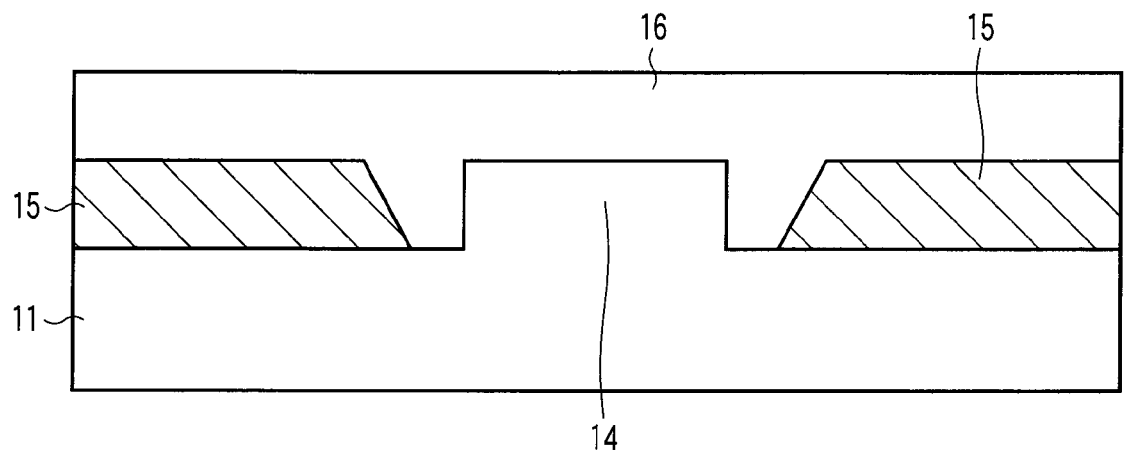
F I G. 21

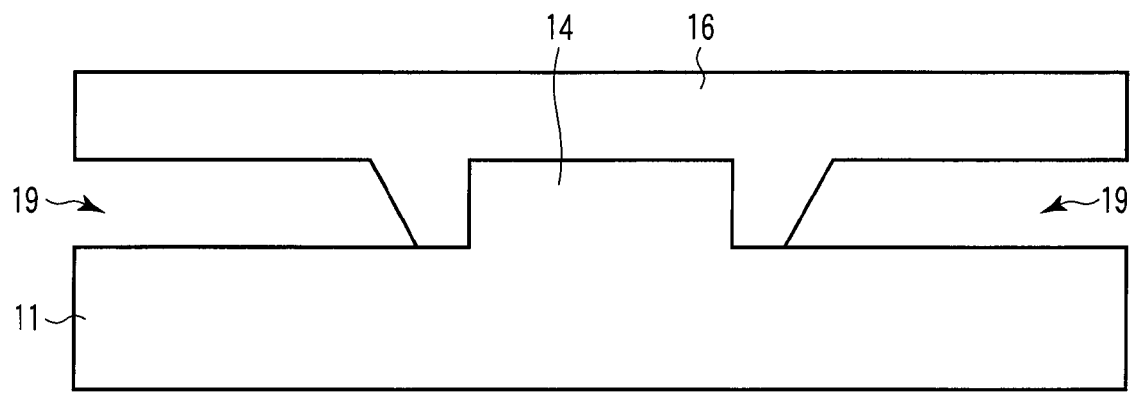
F I G. 22
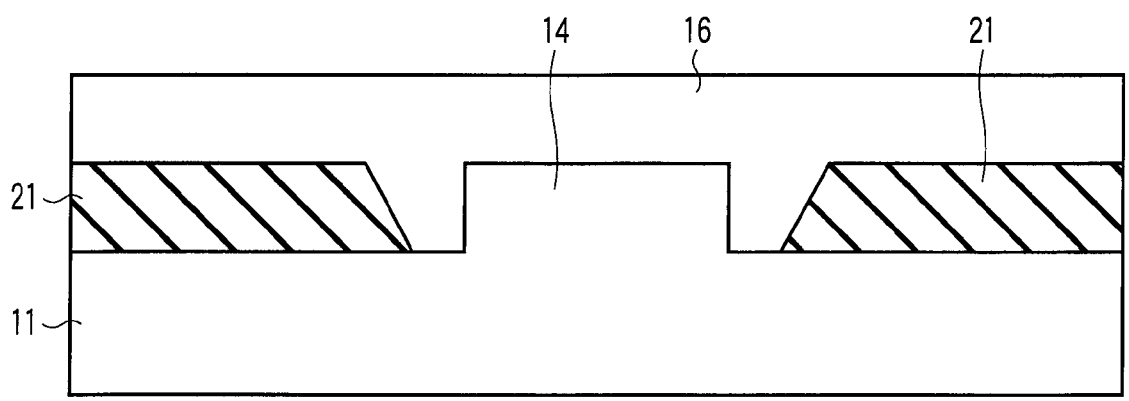
F I G. 23

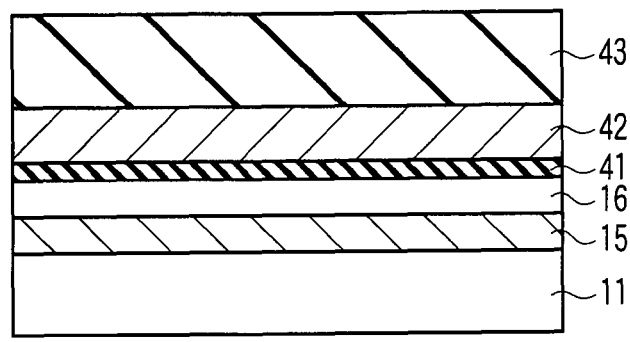
F I G. 28
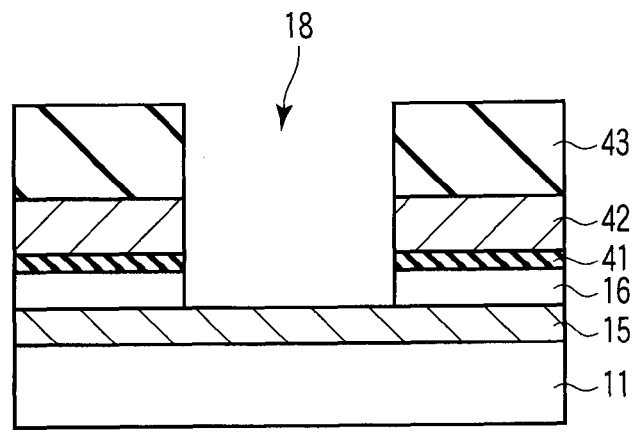
F I G. 29
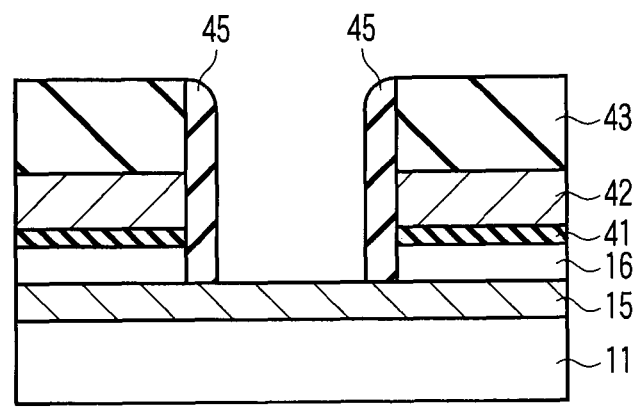
F I G. 30

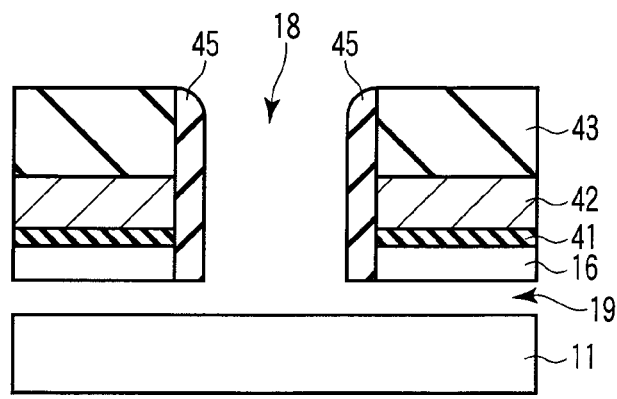
F I G. 31
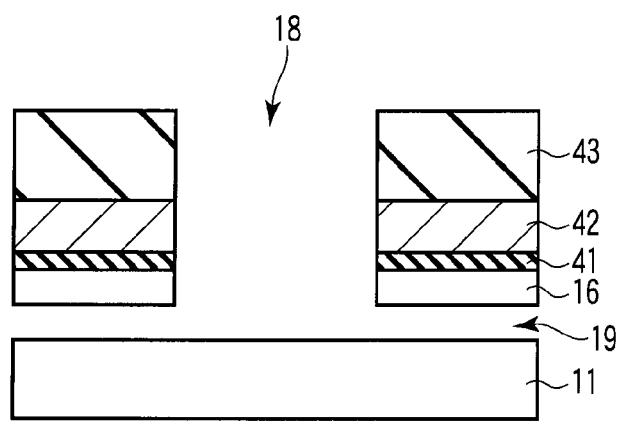
F I G. 32
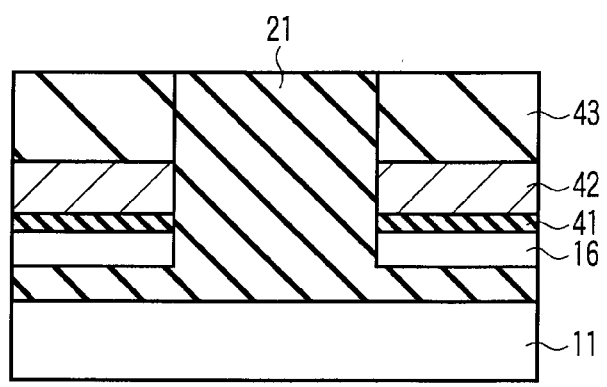
F I G. 33

METHOD OF MANUFACTURING SEMICONDUCTOR DEVICE

CROSS-REFERENCE TO RELATED APPLICATIONS

This application is based upon and claims the benefit of priority from prior Japanese Patent Application No. 2007-167998, filed Jun. 26, 2007, the entire contents of which are incorporated herein by reference.

BACKGROUND OF THE INVENTION

1. Field of the Invention

The present invention relates to a method of manufacturing a semiconductor device.

2. Description of the Related Art

To improve the performance of semiconductor devices, proposals have been made of methods of manufacturing a semiconductor device using an SOI (Silicon On Insulator) technique or an SON (Silicon On Nothing) technique (see, for example, Jpn. Pat. Appln. KOKAI Publication Nos. 2005-45258 and 2006-100322).

FIGS. 34 and 35 show problems with a conventional technique. With this conventional technique, as shown in FIG. 34, an epitaxial SiGe layer 102 and an epitaxial silicon layer 103 are formed on a silicon substrate 101. The epitaxial SiGe layer 102 is subsequently removed to form a cavity. Moreover, as shown in FIG. 35, an insulating film 104 is formed in the cavity. Thus, a semiconductor device (partial SOI substrate) having a partial SOI structure is obtained.

However, with the above-described conventional technique, the epitaxial SiGe layer 102, having an opening 105, is formed on the silicon substrate 101. Thus, owing to the opening 105, a recess portion 106 is formed in the epitaxial silicon layer 103. Therefore, the flatness of a surface of the epitaxial silicon layer 103 may be degraded, affecting the manufacture of the semiconductor device.

Thus, it is conventionally difficult to form a very flat epitaxial semiconductor layer in the semiconductor device having the partial SOI structure.

BRIEF SUMMARY OF THE INVENTION

A method of manufacturing a semiconductor device according to an aspect of the present invention comprises removing a part of a semiconductor substrate to form a protruding portion and a recess portion in a surface area of the semiconductor substrate; forming a first epitaxial semiconductor layer in the recess portion; forming a second epitaxial semiconductor layer on the protruding portion and the first epitaxial semiconductor layer; removing a first part of the second epitaxial semiconductor layer with a second part of the second epitaxial semiconductor layer left to expose a part of the first epitaxial semiconductor layer; and etching the first epitaxial semiconductor layer from the exposed part of the first epitaxial semiconductor layer to form a cavity under the second part of the second epitaxial semiconductor layer.

BRIEF DESCRIPTION OF THE SEVERAL VIEWS OF THE DRAWING

FIGS. 16 to 23 are sectional views schematically showing a manufacturing process according to a fifth variation of the first embodiment of the present invention;

FIGS. 28 to 33 are sectional views schematically showing a manufacturing process according to a variation of the second embodiment of the present invention.

DETAILED DESCRIPTION OF THE INVENTION

Embodiments of the present invention will be described with reference to the drawings.

Embodiment 1

A first embodiment of the present invention will be described with reference to FIGS. 1 to 6, 7 to 10, and 11. FIGS. 1 to 6 are sectional views schematically showing a method of manufacturing a semiconductor device according to the present embodiment. FIGS. 7 to 10 are perspective views schematically showing the method of manufacturing the semiconductor device according to the present embodiment. FIG. 11 is a plan view of a step shown in FIG. 1.

Figure 1:
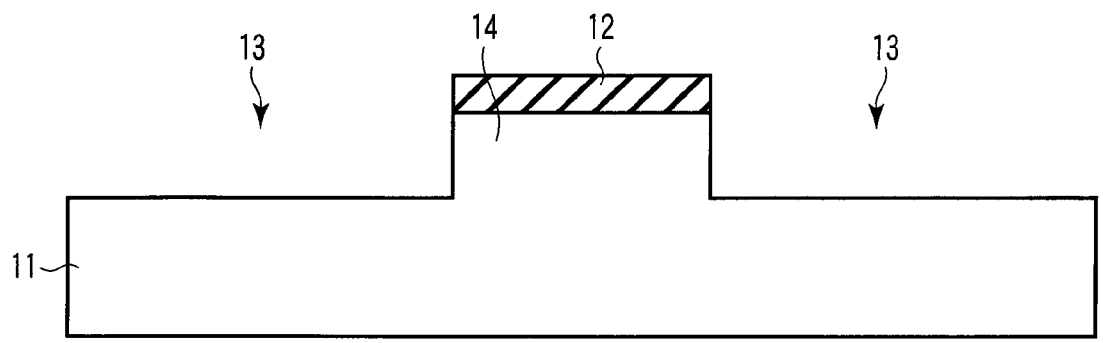
FIGS. 1 to 6 are sectional views schematically showing a process of manufacturing a semiconductor device according to a first embodiment of the present invention.

First, as shown in FIGS. 1 and 11, a mask pattern 12 is formed on a p-type single-crystal silicon substrate (semiconductor substrate) 11. Specifically, a silicon oxide film is formed on the silicon substrate 11 as a mask film. A photo resist pattern (not shown) is formed on the silicon oxide film. The silicon oxide film is patterned using the photo resist pattern as a mask to form a mask pattern 12.

Then, the photo resist pattern is removed, and a part of the silicon substrate 11 is etched away using the mask pattern 12 as a mask. Specifically, the silicon substrate 11 is etched by about 30 nm by means of anisotropic etching such as RIE (Reactive Ion Etching). As a result, recess portions 13 and protruding portions (projection portions) 14 are formed in a surface area of the silicon substrate 11. As shown in FIGS. 1 and 11, the recess portions 13 and the protruding portions 14 are striped.

Figure 2:
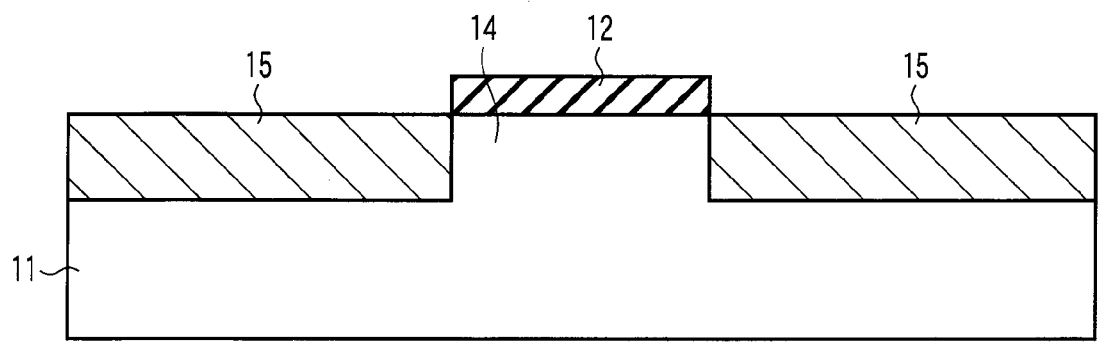

Then, as shown in FIG. 2, an epitaxial SiGe layer (first epitaxial semiconductor layer) 15 of thickness about 30 nm is formed in the recess portions 13 by epitaxial growth to fill the recess portions 13 with the epitaxial SiGe layer 15. That is, the epitaxial SiGe layer 15 is formed such that the height of a top surface of the epitaxial SiGe layer 15 is almost the same as that of a top surface of each of the protruding portions 14. Since the silicon oxide film 12 is formed on the protruding portions 14, the epitaxial SiGe layer 15 is not formed on the protruding portions 14. A silane gas is used as a silicon (Si) source for the epitaxial SiGe layer 15. A germane gas is used as a germanium (Ge) source. By adding hydrochloric acid to the source gases, the epitaxial SiGe layer 15 can be selectively formed only on an exposed surface of the silicon substrate 11. The Ge concentration of the epitaxial SiGe layer 15 can be varied by controlling the flow rates of the source gases. By setting the Ge concentration of the epitaxial SiGe layer 15 to at most about 40 atom percent, it is possible to form the epitaxial SiGe layer 15 having few crystal defects and exhibiting a high surface flatness.

Figure 3:
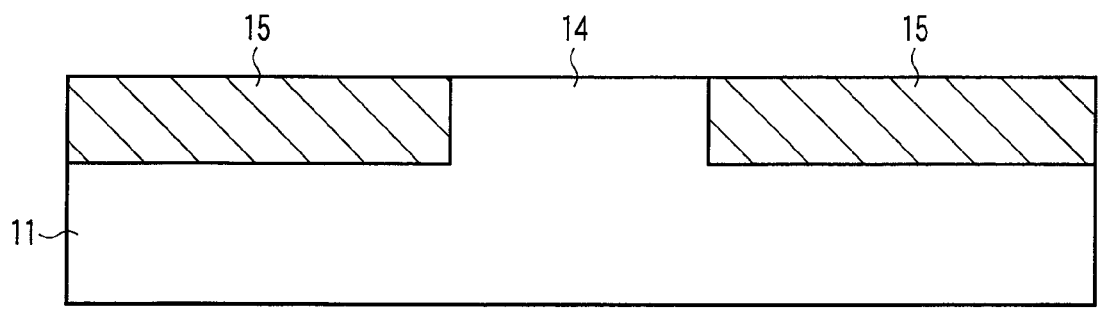

Then, the mask pattern 12 is etched away using diluted fluorinated acid or the like as shown in FIG. 3.

Figure 4:
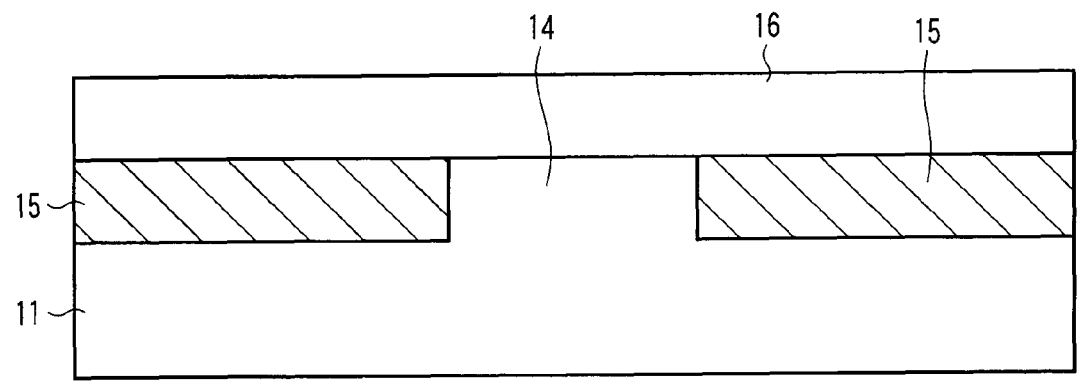

Then, as shown in FIG. 4, an epitaxial silicon layer (second epitaxial semiconductor layer) 16 of thickness about 30 nm is formed on the protruding portions 14 of the silicon substrate 11 and on the epitaxial SiGe layer 15. During this epitaxial growth, the epitaxial silicon layer 16 of almost the same thickness is formed on the protruding portions 14 of the silicon substrate 11 and on the epitaxial SiGe layer 15. Consequently, a top surface of the epitaxial silicon layer 16 is flattened.

Figure 7:
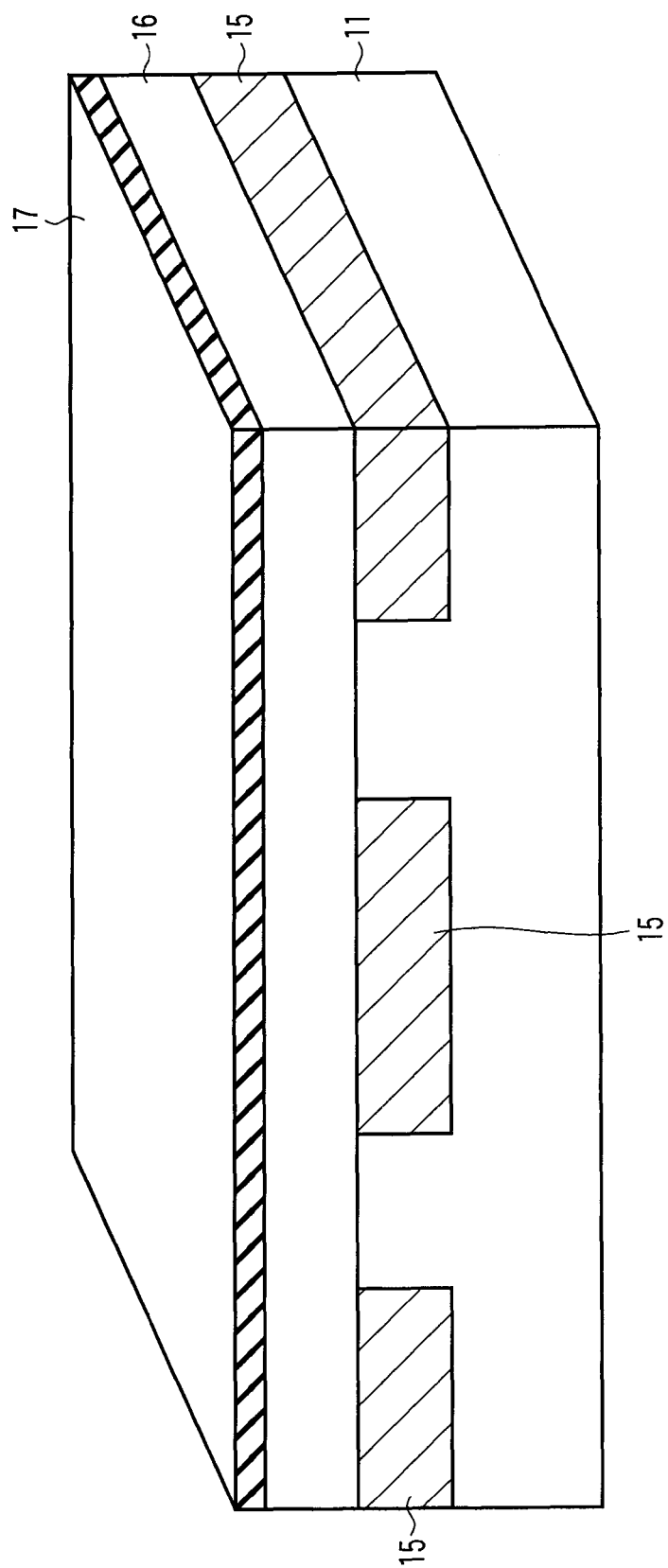
FIGS. 7 to 10 are perspective views schematically showing the process of manufacturing the semiconductor device according to the first embodiment of the present invention.

Then, as shown in FIG. 7, a silicon oxide film 17 is formed on the epitaxial silicon layer 16.

Figure 8:
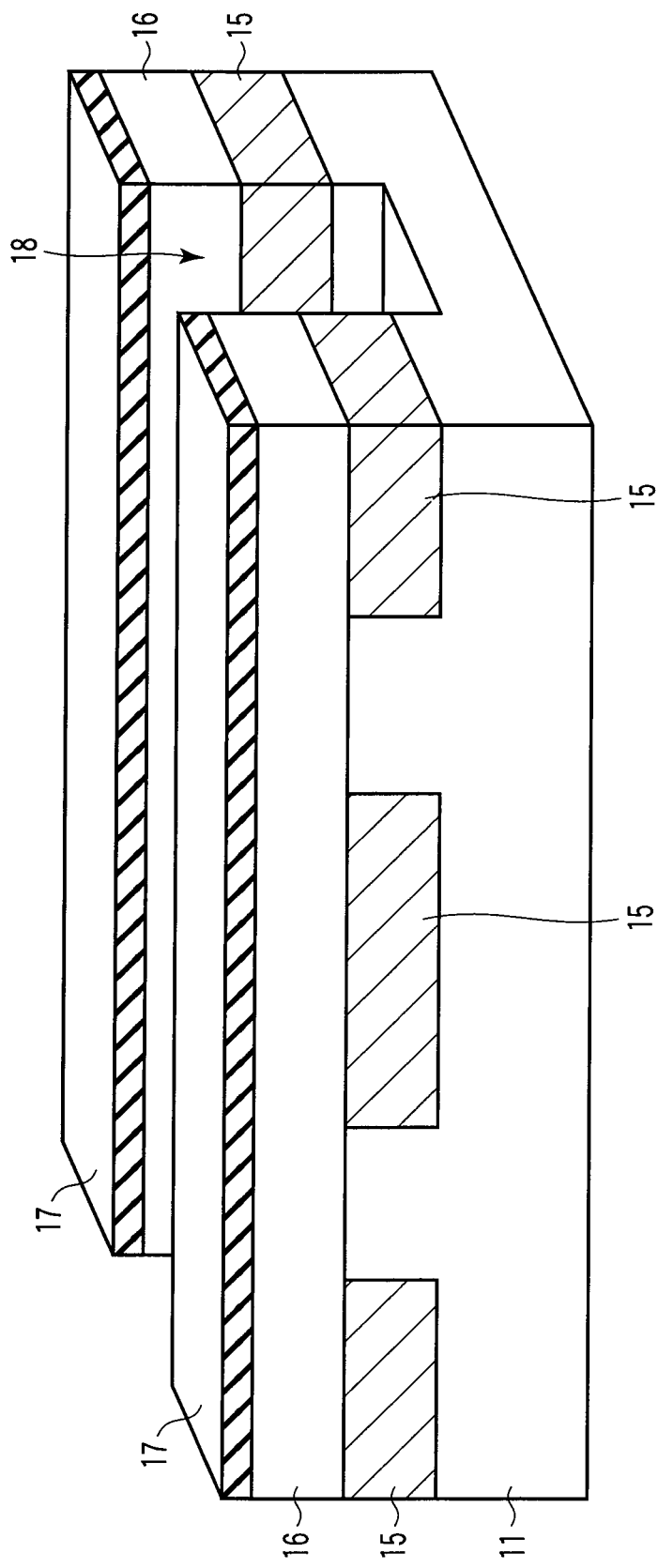

Then, as shown in FIG. 8, a photo resist pattern (not shown) is formed on the silicon oxide film 17. A direction in which the photo resist pattern extends is perpendicular to the photo resist pattern formed in the step shown in FIG. 1. The silicon oxide film 17, the epitaxial silicon layer 16, the epitaxial SiGe layer 15, and the silicon substrate 11 are etched by anisotropic etching such as RIE using the photo resist pattern as a mask to form a trench 18. This etching step removes a part (first part) of the epitaxial silicon layer 16 which is not covered with the photo resist pattern, while leaving a part (second part) of the epitaxial silicon layer 16 which is covered with the photo resist pattern. Since the first part of the epitaxial silicon layer 16 is removed, a part of the epitaxial SiGe layer 15 is exposed. In the present embodiment, side surfaces of the epitaxial SiGe layer 15 are exposed.

Figure 5:
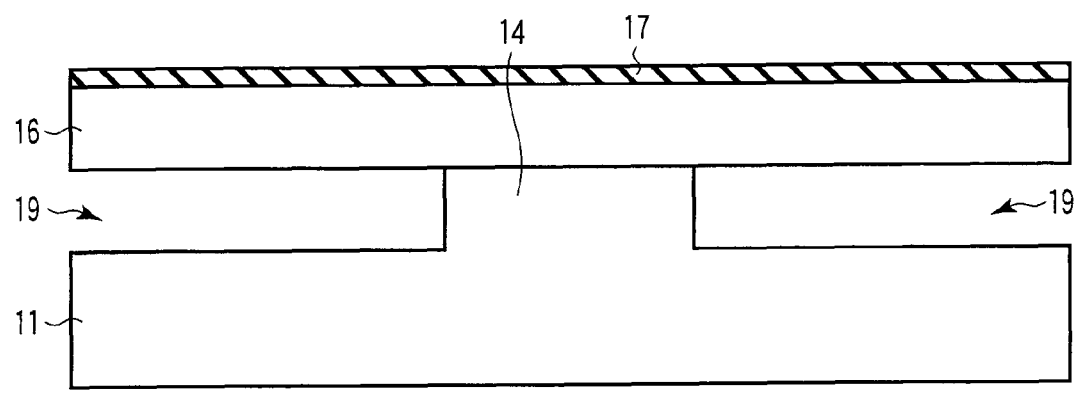
Figure 9:
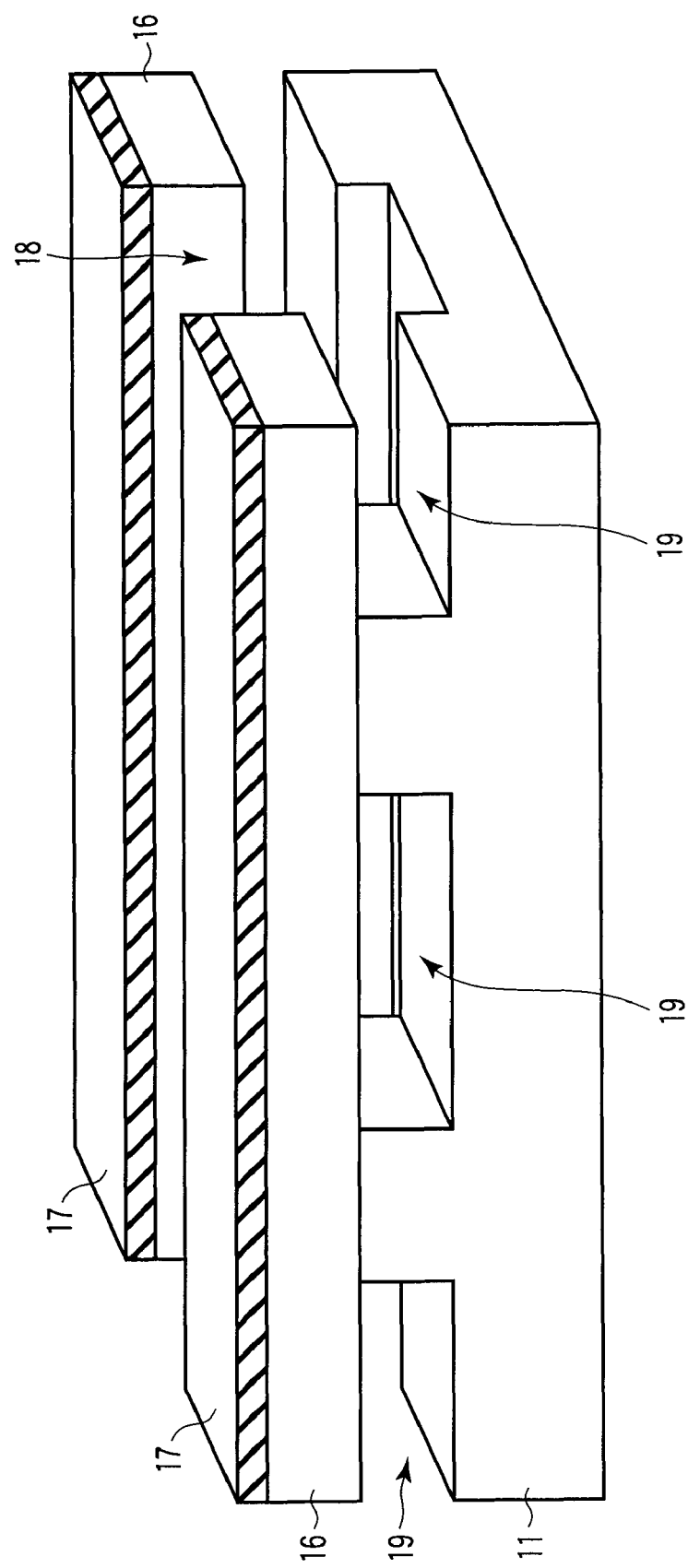

Then, as shown in FIGS. 5 and 9, the epitaxial SiGe layer 15 is removed by isotropic etching. That is, etching is allowed to progress from the exposed part of the epitaxial SiGe layer 15 to remove the epitaxial SiGe layer 15. As a result, cavities 19 are formed under the epitaxial silicon layer 16. An etchant containing nitric acid ($HNO_3$) with fluorinated acid (HF) addition is used for the isotropic etching. Provided that the Ge concentration of the epitaxial SiGe layer 15 is at least about 10 atom percent, the epitaxial SiGe layer 15 can be etched at a sufficiently high etching selection ratio of the epitaxial SiGe layer 15 to the silicon substrate 11 and the epitaxial silicon layer 16.

Figure 6:
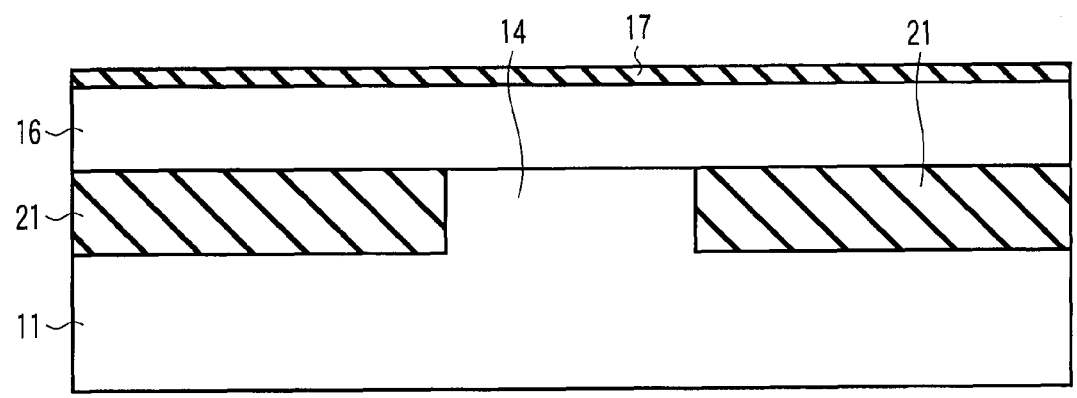
Figure 10:
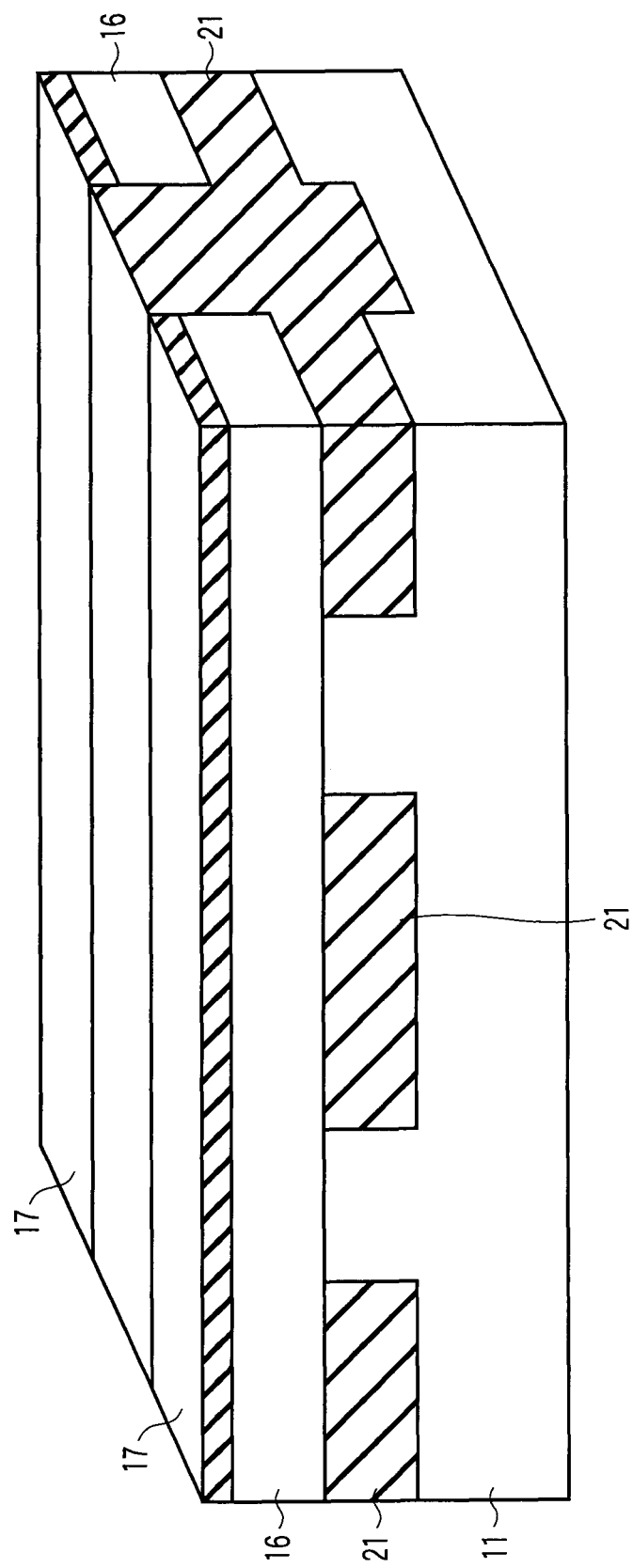
Figure 11:
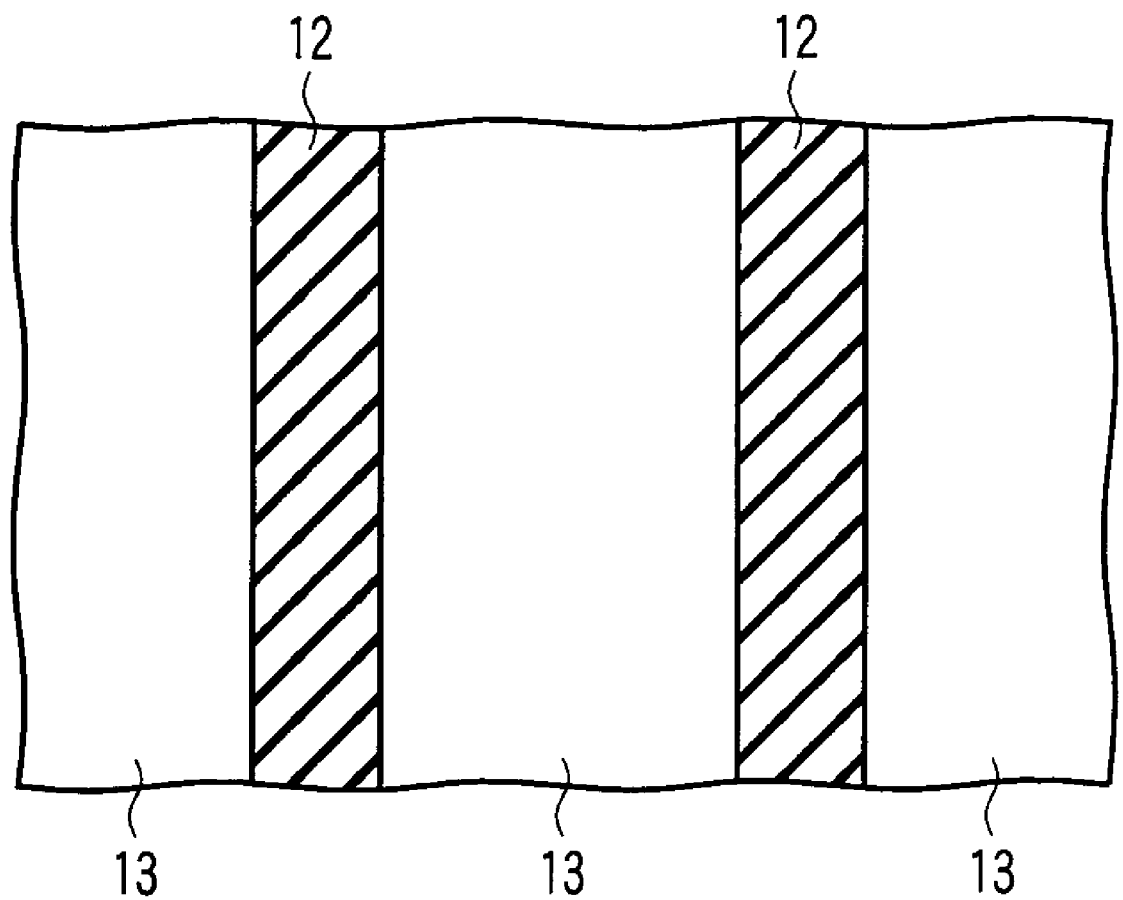
FIG. 11 is a plan view schematically showing a part of the process of manufacturing the semiconductor device according to the first embodiment of the present invention.

Then, as shown in FIGS. 6 and 10, an insulating film 21 is formed in the trench 18 and the cavities 19. By using a coating film such as a polysilazane film as the insulating film 21, it is possible to fill the trench 18 and the cavities 19 with the insulating film 21. The insulating film 21 formed in the trench 18 can function as an isolation insulating film.

In this manner, a semiconductor substrate (partial SOI substrate) having a partial SOI structure is obtained as shown in FIGS. 6 and 10. Although the subsequent steps are not shown, active elements such as MIS transistors are formed on the epitaxial silicon layer 16, formed on the insulating film 21. Moreover, a wiring step and the like are carried out to complete a semiconductor device such as LSI.

As described above, in the present embodiment, the recess portions 13 are formed in the silicon substrate 11, and the epitaxial SiGe layer 15 is formed in the recess portions 13. Thus, the height of the top surface of the epitaxial SiGe layer 15 can be made almost the same as that of the top surface of each of the protruding portions 14. As a result, the very flat epitaxial silicon layer 16 can be formed on the epitaxial SiGe layer 15 and on the protruding portions 14 of the silicon substrate 11. Thus, the present embodiment makes it possible to form the SOI structure having the very flat epitaxial silicon layer, providing an excellent semiconductor device. Furthermore, the insulating film 21 formed in the trench 18 can be used as an isolation insulating film. As a result, the manufacturing process can be simplified.

Variations of the present embodiment will be described below.

Figure 12:
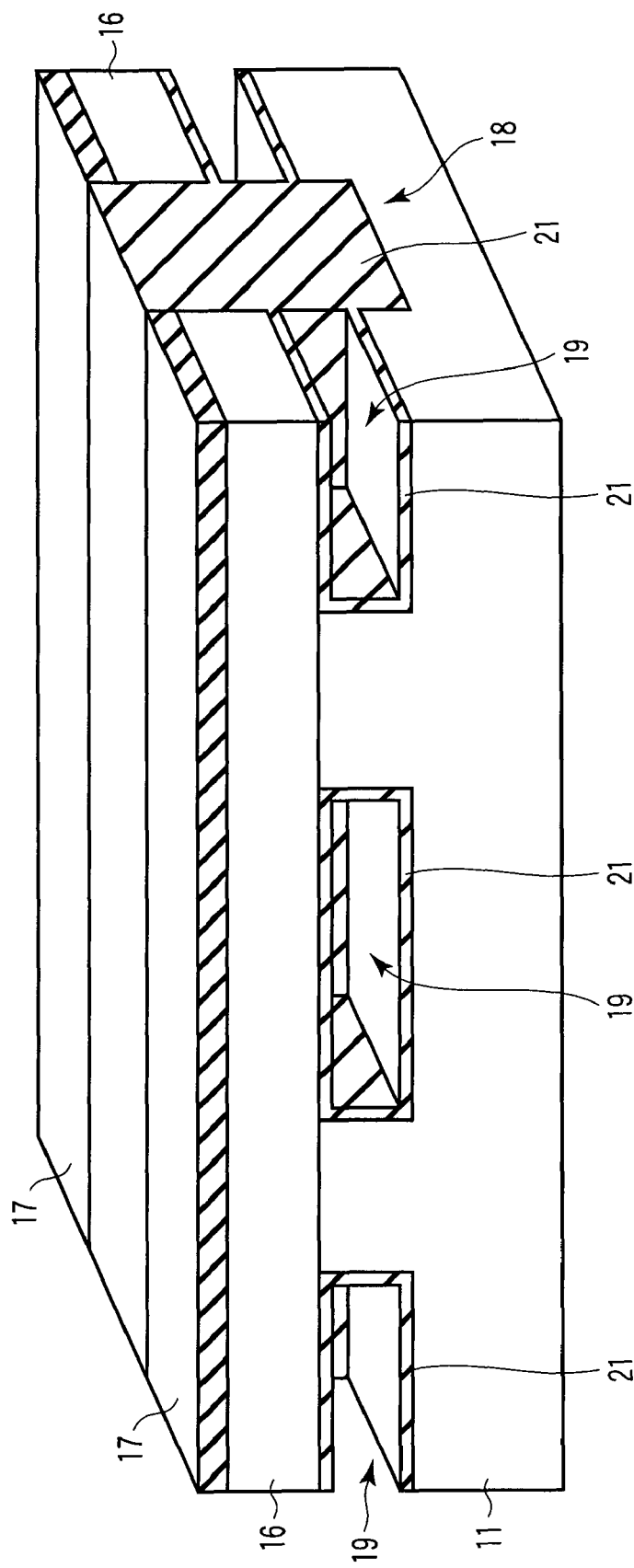
FIG. 12 is a perspective view schematically showing a part of a manufacturing process according to a first variation of the first embodiment of the present invention.

FIG. 12 is a perspective view schematically showing a first variation of the present embodiment. In the above-described embodiment, the insulating film 21 is formed in the entire cavities 19 using the isotropic deposition method. However, the insulating film 21 need not necessarily be formed in the entire cavities 19. In FIG. 12, the anisotropic deposition method is used to form the insulating film (silicon oxide film) 21, while leaving the cavities 19. With the anisotropic deposition method, a deposition speed in a vertical direction is higher than that in a horizontal direction. Thus, the trench 18 is completely filled with the insulating film 21, but the cavities 19 are not completely filled with the insulating film 21. The insulating film 21 is formed along inner surfaces of the cavities 19. HDP (High Density Plasma) can be used as the anisotropic deposition method.

In the present variation, the cavities 19 are left as described above to enable a decrease in the dielectric constant of the insulating area under the epitaxial silicon layer 16. As a result, the operating speed of elements can be increased. This also enables a reduction in stress generated between the epitaxial silicon layer 16 and the insulating area located under the epitaxial silicon layer 16.

In addition, in the example shown in FIG. 12, the thin insulating film 21 is formed along the inner surfaces of the cavities 19. However, it is possible to avoid forming the insulating film 21 in the cavities 19. In this case, a semiconductor substrate (partial SON substrate) having a partial SON structure is obtained.

Figure 13:
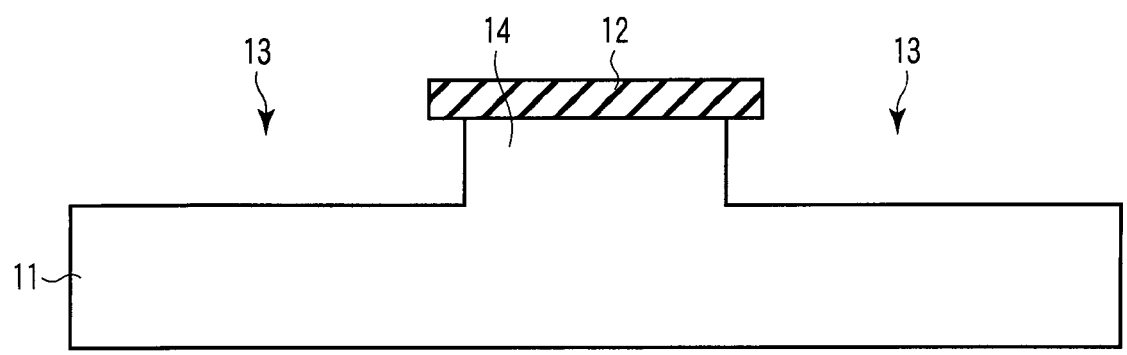
FIGS. 13 and 14 are sectional views schematically showing a part of a manufacturing process according to a second variation of the first embodiment of the present invention.
Figure 14:
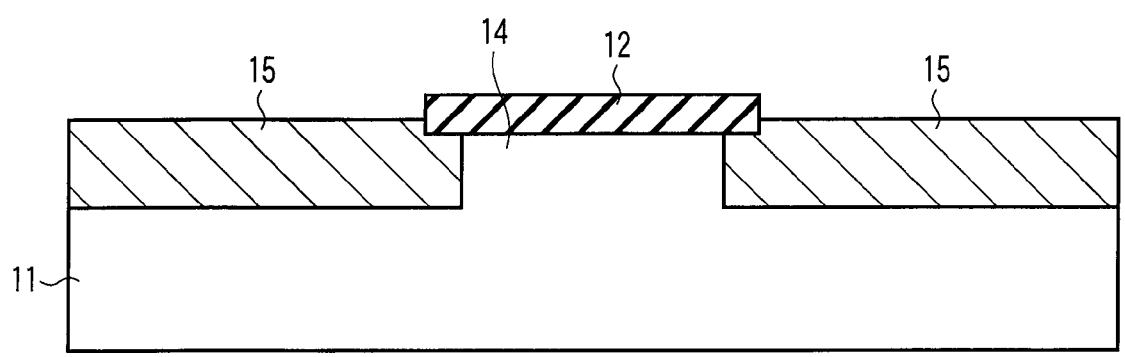

FIGS. 13 and 14 are sectional views schematically showing a second variation of the present embodiment. In the above-described embodiment, in the step shown in FIG. 1, the recess portions 13 are formed in the silicon substrate 11 by anisotropic etching. However, in the present variation, the recess portions 13 are formed by isotropic etching. As a result, as shown in FIG. 13, the width of each of the protruding portions 14 is smaller than that of the mask pattern 12. Subsequently, as in the case of the step shown in FIG. 2 and described above in the embodiment, the epitaxial SiGe layer 15 is formed in the recess portions 13 as shown in FIG. 14.

Thus, in the present variation, the width of each of the protruding portions 14 of the silicon substrate 14 is smaller than that of the mask pattern 12. Consequently, even with a slight variation in the thickness of the epitaxial SiGe layer 15, no step is formed in the boundary portion between the protruding portion 14 of the silicon substrate 11 and the epitaxial SiGe layer 15. The presence of a step in the boundary portion between the silicon substrate 11 and the epitaxial SiGe layer 15 makes it difficult to form the appropriate epitaxial silicon layer 16 during the step shown in FIG. 4. The present variation involves no step at the boundary portion between the protruding portions 14 and the epitaxial SiGe layer 15, making it possible to provide the appropriate epitaxial silicon layer 16.

Now, a third variation of the present embodiment will be described. In the above-described embodiment, the Ge concentration of the epitaxial SiGe layer 15 is fixed. However, the Ge concentration may be varied in the direction of the thickness of the epitaxial SiGe layer 15. The Ge concentration can be varied by controlling the flow rates of the silicon (Si) source and the germanium (Ge) source. Specifically, first, a first SiGe layer is formed which has a first Ge concentration (for example, 10 atom percent). A second SiGe layer is subsequently formed which has a second Ge concentration (for example, 35 atom percent) higher than the first Ge concentration. A third SiGe layer is finally formed which has a third Ge concentration (for example, 5 atom percent) lower than the second Ge concentration.

As described above, in the present variation, the first SiGe layer, which is in contact with the silicon substrate 11, has the low Ge concentration (a high Si concentration). Thus, the epitaxial SiGe layer 15 with a low defect density can be formed. Furthermore, the third SiGe layer, which is in contact with the epitaxial silicon layer 16, has the low Ge concentration (a high Si concentration). Thus, the epitaxial silicon layer 16 with a low defect density can be formed. Additionally, the second SiGe layer, positioned between the first SiGe layer and the third SiGe layer, has the high Ge concentration. This enables an increase in the etching rate at which the epitaxial SiGe layer 15 is etched in the step shown in FIG. 5. It is therefore possible to form an acceptable epitaxial layer and to reduce process time.

Figure 15:
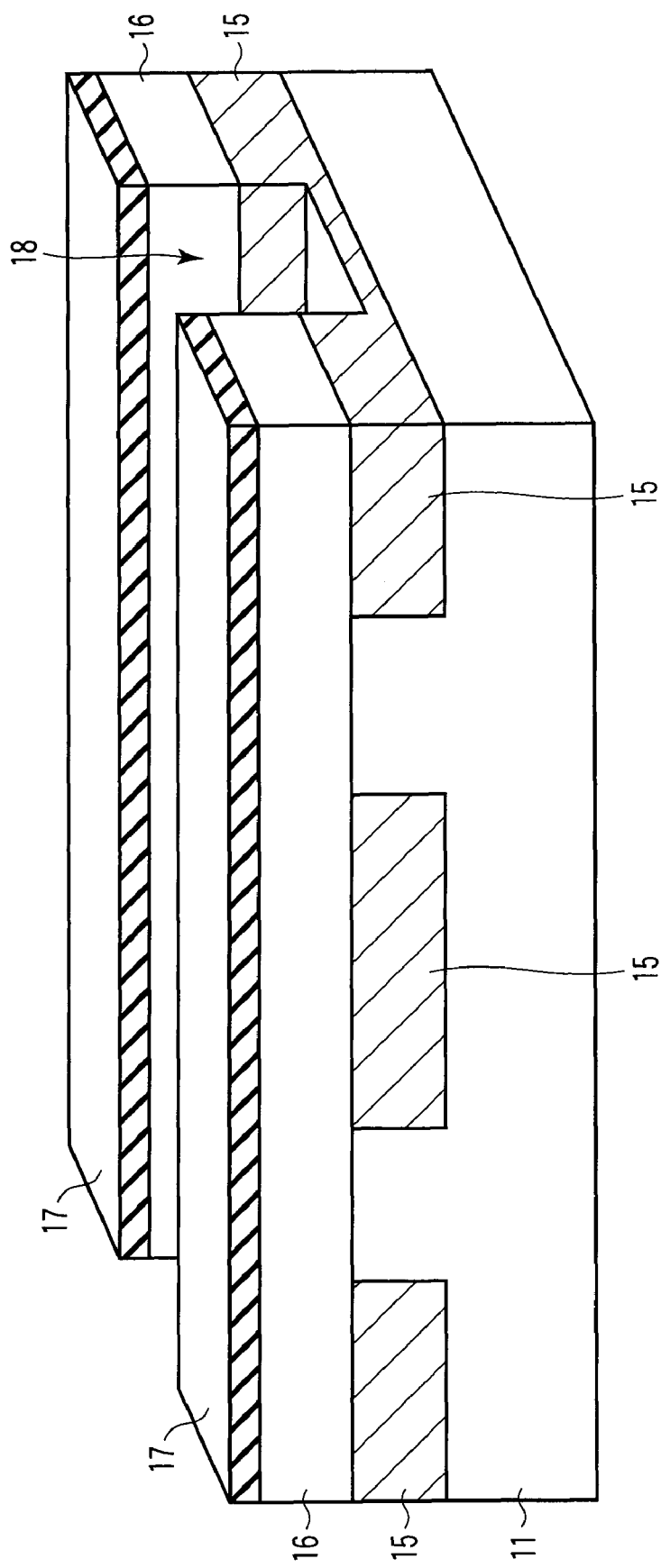
FIG. 15 is a perspective view schematically showing a part of a manufacturing process according to a fourth variation of the first embodiment of the present invention.

FIG. 15 is a perspective view schematically showing a fourth variation of the present embodiment. In the above-described embodiment, in the step shown in FIG. 8, the trench 18 is formed to be deeper than a bottom surface of the epitaxial SiGe layer 15. However, as shown in FIG. 15, the trench 18 may be formed to be shallower than the bottom surface of the epitaxial SiGe layer 15. If the trench 18 is thus formed to be shallow, the etching time for the epitaxial SiGe layer 15 increases. However, in the step shown in FIGS. 6 and 10, the insulating film 21 having a reduced thickness is formed in the trench 18. Thus, advantageously, a crystal defect is unlikely to occur in the epitaxial layer.

FIGS. 16 to 23 are sectional views schematically showing a fifth variation of the present embodiment. In the above-described embodiment, the epitaxial SiGe layer 15 is in contact with the protruding portions 14 of the silicon substrate 11. However, the epitaxial SiGe layer 15 may avoid contacting the protruding portions 14 of the silicon substrate 11. This process will be described with reference to FIGS. 16 to 23.

In the present variation, as shown in FIG. 16, a stack of a silicon oxide film 31, a silicon nitride film 32, and a silicon oxide film 33 is used as a mask to etch away a part of the silicon substrate 11. Thus, the recess portions 13 and the protruding portions 14 are formed in the surface area of the silicon substrate 11.

Then, as shown in FIG. 17, a silicon oxide film 34 is formed all over a top surface of the resulting structure. Moreover, as shown in FIG. 18, the silicon nitride film 32, the silicon oxide film 33, and the silicon oxide film 34 are etched using anisotropic etching or the like. Thus, a structure is obtained in which the top surface and side surfaces of the protruding portions 14 of the silicon substrate 11 are covered with the silicon oxide films 31 and 34.

Then, as shown in FIG. 19, the epitaxial SiGe layer 15 is formed in the recess portions 13 as is the case with the step shown in FIG. 2. At this time, since the top and side surfaces of the protruding portions 14 of the silicon substrate 11 are covered with the silicon oxide films 31 and 34, the epitaxial SiGe layer 15 is formed only on an exposed surface of each of the recess portions 13 of the silicon substrate 11.

Then, as shown in FIG. 20, the silicon oxide films 31 and 34 are etched away. As a result, a space 35 is formed between each of the protruding portions 14 of the silicon substrate 11 and the epitaxial SiGe layer 15.

Then, as shown in FIG. 21, the epitaxial silicon layer 16 is formed all over the top surface of the resulting structure as is the case with the step shown in FIG. 4. In this epitaxial growth, the epitaxial silicon layer 16 of almost the same thickness is formed on each of the protruding portions 14 of the silicon substrate 11 and on the epitaxial SiGe layer 15. Consequently, the top surface of the epitaxial silicon layer 16 is flattened. Subsequently, as is the case with the step shown in FIG. 8, the epitaxial silicon layer 16, the epitaxial SiGe layer 15, and the silicon substrate 11 are etched to form the trench 18 (see FIG. 8).

Then, as shown in FIG. 22, the epitaxial SiGe layer 15 is removed by isotropic etching to form the cavities 19 as is the case with the step shown in FIGS. 5 and 9. Then, as shown in FIG. 23, the insulating film 21 is formed in the trench 18 and the cavities 19 as is the case with the step shown in FIGS. 6 and 10.

In this manner, in the present variation, the silicon oxide film 34 is formed on the side surfaces of each of the protruding portions 14 of the silicon substrate 11. Thus, the epitaxial SiGe layer 15 does not grow from the side surfaces of the protruding portion 14 of the silicon substrate 11 but only from a bottom surface of each of the recess portions 13 of the silicon substrate 11. As a result, the acceptable epitaxial SiGe layer 15 can be formed, and the acceptable epitaxial silicon layer 16 can be formed.

Given that the area of a part of the epitaxial silicon layer 16 which is formed on a top surface of the insulating film 21 is fixed, the area of each of the protruding portions 14 is smaller in FIG. 23 than in FIG. 6. Thus, if an impurity-doped layer is formed in the epitaxial silicon layer 16, then the present variation enables a reduction in the amount of impurity elements diffused to the protruding portion 14. Therefore, an impurity element profile of the impurity doped layer can be accurately controlled, making it possible to inhibit a possible variation in device characteristics.

Furthermore, in the present variation, the tip of each of the cavities 19 is tapered as shown in FIG. 22. Thus, the cavity 19 can be appropriately filled with the insulating film 21.

Embodiment 2

FIGS. 24 to 27 are perspective views schematically showing a method of manufacturing a semiconductor device according to a second embodiment of the present invention. The basis structure of the semiconductor device and a basic manufacturing method according to the second embodiment are similar to those in the first embodiment. Thus, the description of matters described in the first embodiment is omitted. The present embodiment relates mainly to the manufacture of a NAND nonvolatile memory configured such that a plurality of memory cells connected in series are provided between a pair of select transistors.

Figure 24:
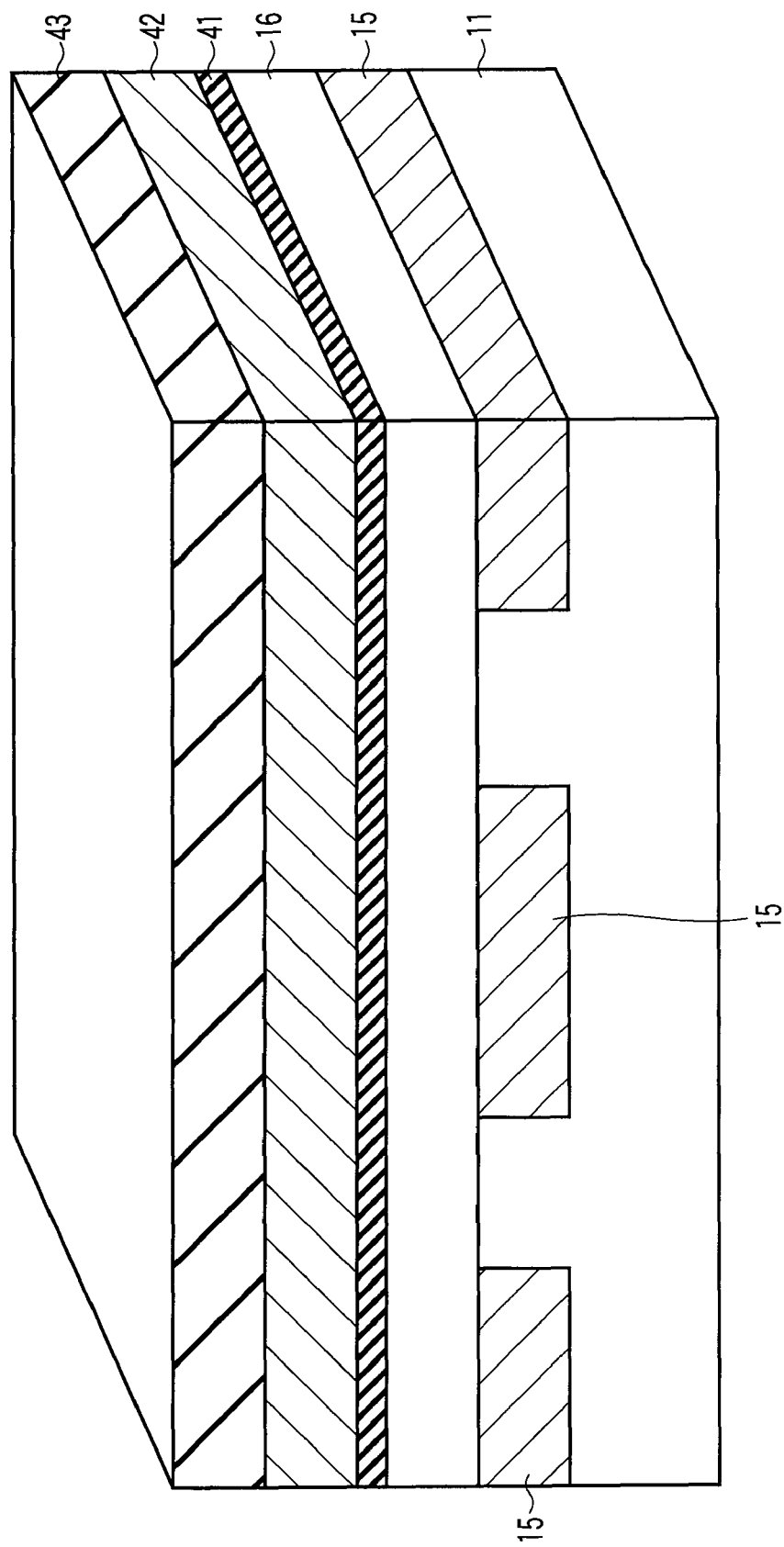
FIGS. 24 to 27 are perspective views schematically showing a process of manufacturing a semiconductor device according to a second embodiment of the present invention.

First, the steps shown in FIGS. 1 to 4 are carried out as is the case with the first embodiment. Then, as shown in FIG. 24, a silicon oxide film is formed on the epitaxial silicon layer 16 as a tunnel insulating film (gate insulating film) 41. A polysilicon film is subsequently formed on the tunnel insulating film 41 as a floating gate electrode film (gate electrode film) 42. Moreover, a silicon nitride film 43 is formed on the floating gate electrode film 42.

Figure 25:
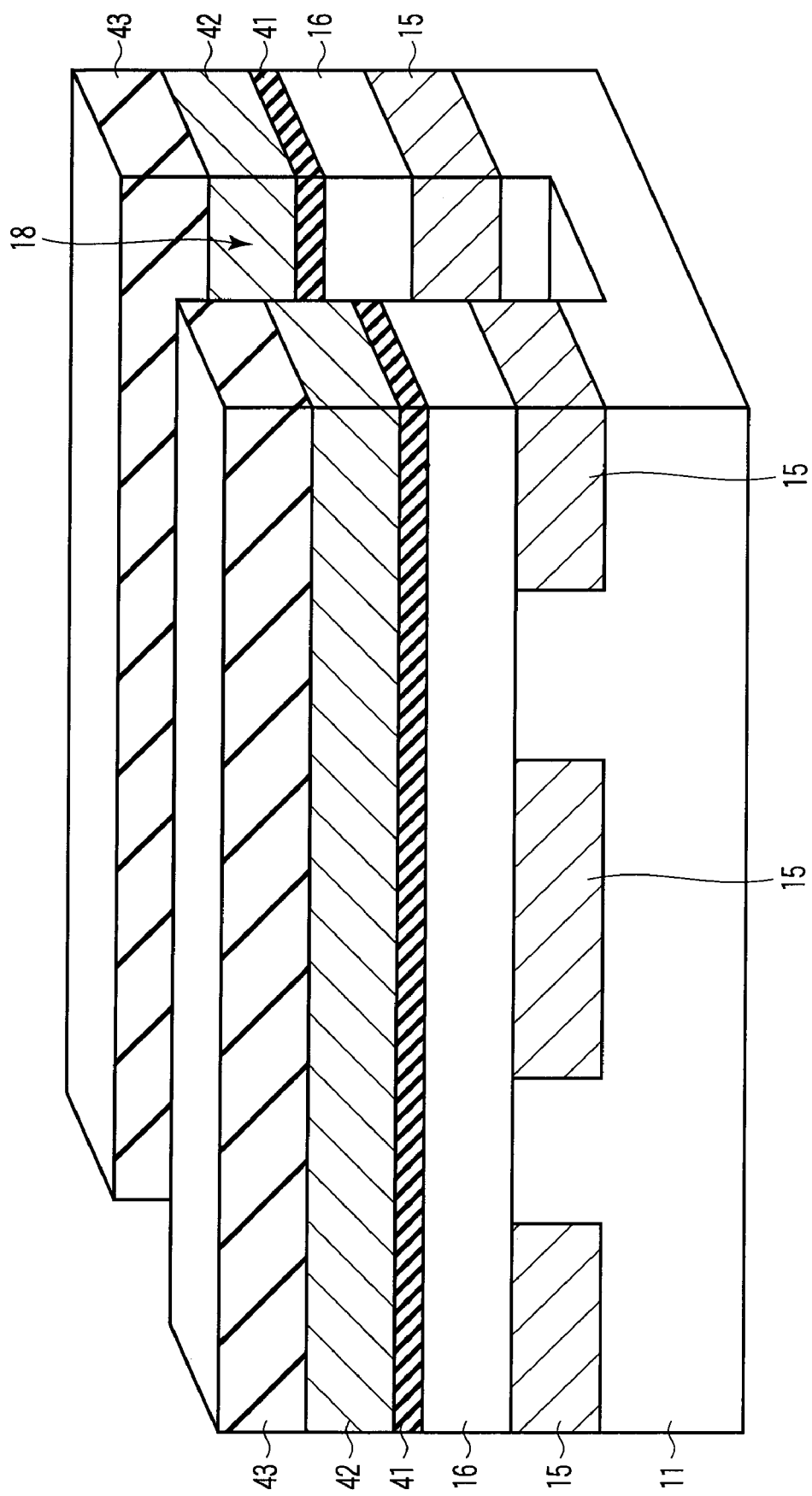

Then, as shown in FIG. 25, the trench 18 is formed as is the case with the step of the first embodiment shown in FIG. 8. That is, the trench 18 is formed by etching the silicon nitride film 43, the floating gate electrode film 42, the tunnel insulating film 41, the epitaxial silicon layer 16, the epitaxial SiGe layer 15, and the silicon substrate 11 by anisotropic etching such as RIE. As a result, the side surfaces of the epitaxial SiGe layer 15 are exposed.

Figure 26:
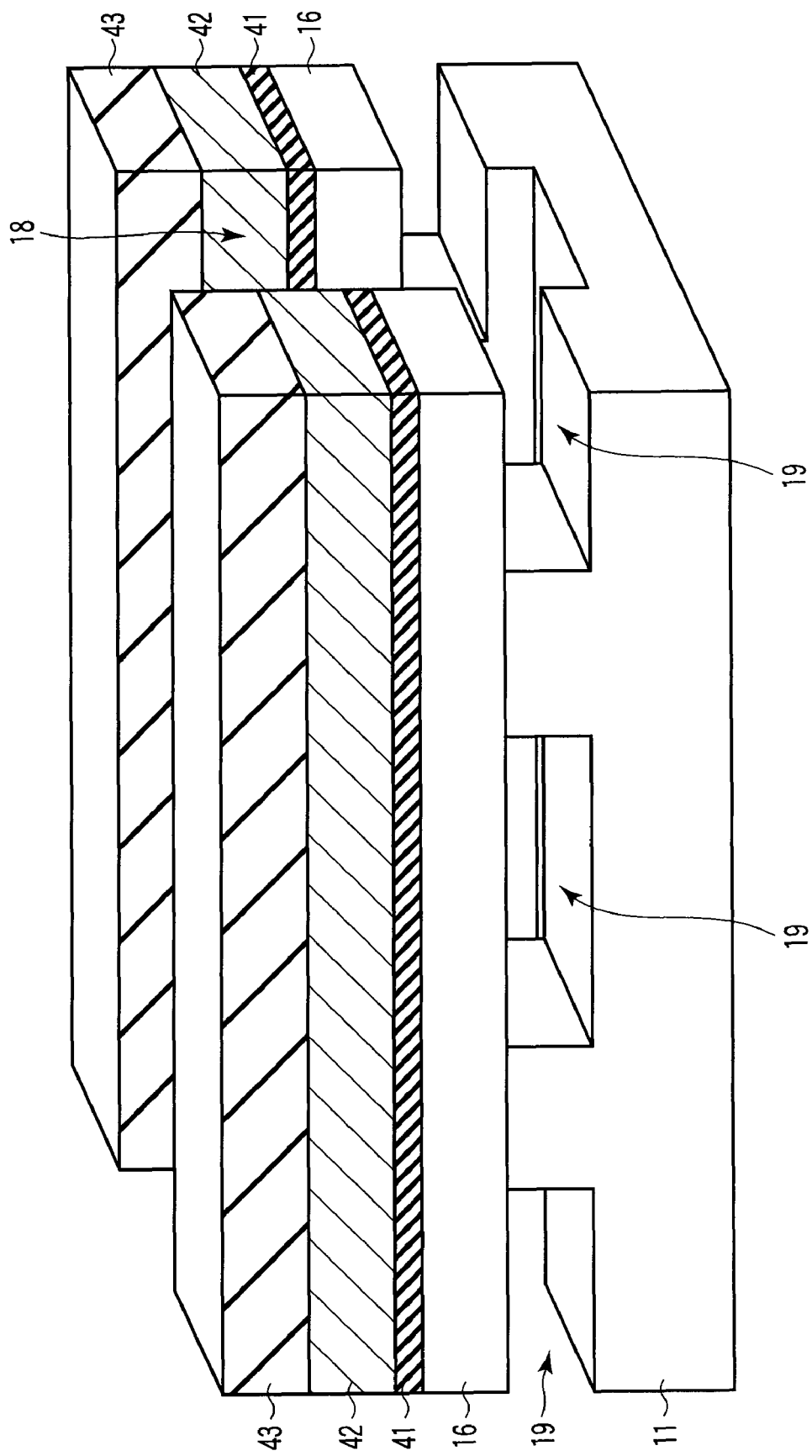

Then, as shown in FIG. 26, the epitaxial SiGe layer 15 is removed by isotropic etching as is the case with the step of the first embodiment shown in FIGS. 5 and 9. As a result, the cavities 19 are formed under the epitaxial silicon layer 16.

Figure 27:
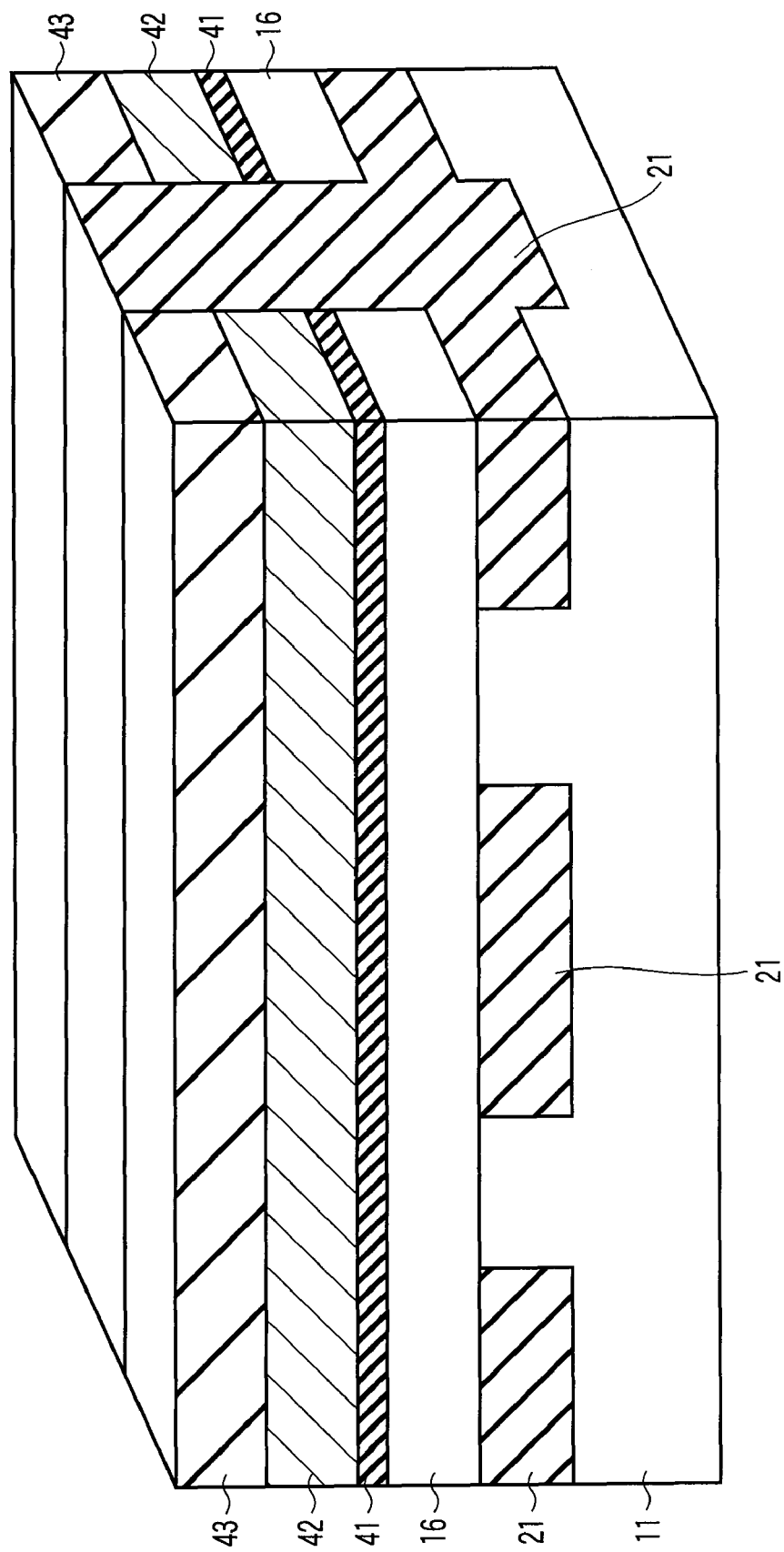
Figure 34:
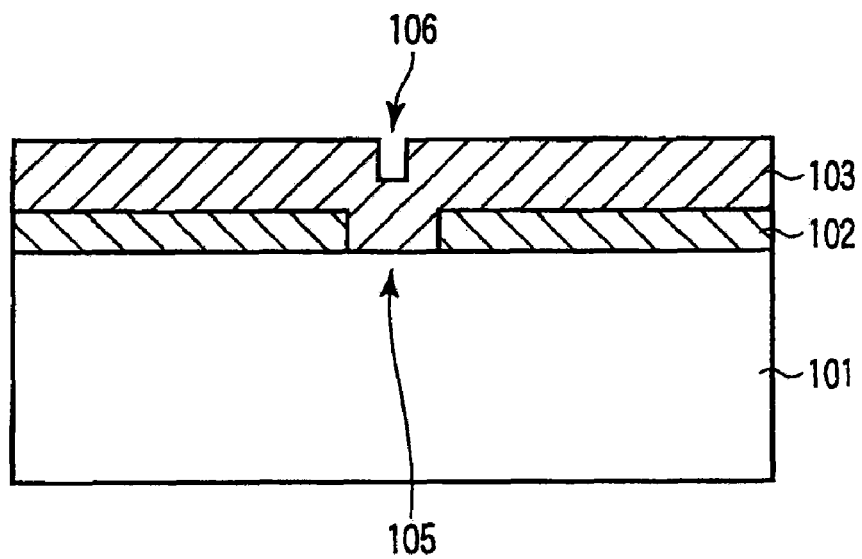
FIGS. 34 and 35 are diagrams illustrating problems with a conventional technique.
Figure 35:
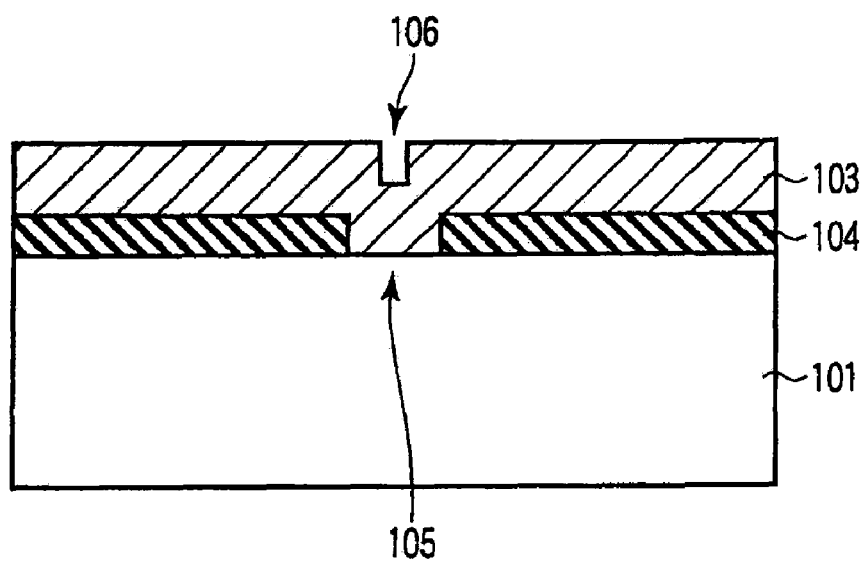

Then, as shown in FIG. 27, the insulating film 21 is formed in the trench 18 and the cavities 19 as is the case with the step of the first embodiment shown in FIGS. 6 and 10. The insulating film 21 formed in the trench 18 can function as an isolation insulating film.

In this manner, such a partial SOI structure as shown in FIG. 27 is obtained. Although the subsequent steps are not shown, a step of forming an inter-electrode insulating film and a control gate electrode film is carried out as is the case with normal NAND nonvolatile memories. Moreover, a step similar to a normal step of forming a NAND nonvolatile memory is carried out to form active elements such as memory cells and select transistors on the epitaxial silicon layer 16, formed on the insulating film 21. Moreover, a wiring step and the like are carried out to complete a semiconductor device such as LSI.

The polysilicon film used as the floating gate electrode film 42 needs to finally contain impurities such as phosphorous (P). However, it is difficult to increase the etching selection ratio of the epitaxial SiGe layer 15 to the polysilicon film containing impurities. Thus, if the polysilicon film (floating gate electrode film) 42 contains the impurities when the epitaxial SiGe layer 15 is etched in the step shown in FIG. 26, the polysilicon film 42 is also etched. Thus, when the epitaxial SiGe layer 15 is etched in the step shown in FIG. 26, the polysilicon film 42 preferably contains no doped impurities. For example, after the insulating film 21 is formed in the step shown in FIG. 27, the impurities are preferably introduced into the polysilicon film (floating gate electrode film) 42 by ion implantation or the like.

As described above, like the first embodiment, the present embodiment enables the very flat epitaxial silicon layer 16 to be formed, providing an excellent semiconductor device. Furthermore, the insulating film 21 formed in the trench 18 can be used as an isolation insulating film. The manufacturing process can thus be simplified.

FIGS. 28 to 33 are sectional views schematically showing a manufacturing process according to a variation of the present embodiment. The present variation also relates to the manufacture of a NAND nonvolatile memory.

As also described above in the embodiment, if the polysilicon film (floating gate electrode film) 42 contains the impurities when the epitaxial SiGe layer 15 is etched in the step shown in FIG. 26, the polysilicon film 42 is also etched. The present variation solves this problem using a manufacturing method shown in FIGS. 28 to 33.

First, the steps shown in FIGS. 1 to 4 are carried out as is the case with the first embodiment. Then, as shown in FIG. 28, a silicon oxide film is formed on the epitaxial silicon layer 16 as the tunnel insulating film 41. A polysilicon film is subsequently formed on the tunnel insulating film 41 as the floating gate electrode film 42. The polysilicon film 42 contains impurities such as phosphorous (P). Moreover, the silicon nitride film 43 is formed on the floating gate electrode film 42.

Then, as shown in FIG. 29, the trench 18 is formed as is the case with the step of the first embodiment shown in FIG. 8. That is, the trench 18 is formed by etching the silicon nitride film 43, the floating gate electrode film 42, the tunnel insulating film 41, and the epitaxial silicon layer 16 by anisotropic etching such as RIE. In the present variation, the etching is stopped when the epitaxial SiGe layer 15 is exposed.

Then, as shown in FIG. 30, a sidewall mask 45 using a silicon nitride film is formed on sidewalls of the stack structure formed of the epitaxial silicon layer 16, the tunnel insulating film 41, the floating gate electrode film 42, and the silicon nitride film 43. To prevent the silicon nitride film 43 from being eliminated by etching of the silicon nitride film constituting the sidewall mask 45, the silicon nitride film constituting the sidewall mask 45 is formed to be thinner than the silicon nitride film 43. Furthermore, the sidewall mask 45 is formed to completely cover the side surfaces of the floating gate electrode film (polysilicon film) 42.

Then, as shown in FIG. 31, the epitaxial SiGe layer 15 is removed by isotropic etching as is the case with the step of the first embodiment shown in FIGS. 5 and 9. As a result, the cavities 19 are formed under the epitaxial silicon layer 16. An etchant containing nitric acid ($HNO_3$) with fluorinated acid (HF) addition is used for the isotropic etching. During the isotropic etching, the side surfaces of the floating gate electrode film (polysilicon film) 42 are covered with the sidewall mask 45. Thus, the etchant is prevented from etching the floating gate electrode film (polysilicon film) 42.

Then, as shown in FIG. 32, the sidewall mask 45, formed of the silicon nitride film, is etched away by phosphoric acid ($H_3PO_4$).

Then, as shown in FIG. 33, the insulating film 21 is formed in the trench 18 and the cavities 19 as is the case with the step of the first embodiment shown in FIGS. 6 and 10. The insulating film 21 formed in the trench 18 functions as an isolation insulating film.

In this manner, such a partial SOI structure as shown in FIG. 33 is obtained. Although the subsequent steps are not shown, a step of forming an inter-electrode insulating film and a control gate electrode film is carried out as is the case with normal NAND nonvolatile memories. Moreover, a step similar to a normal step of forming a NAND nonvolatile memory is carried out to form active elements such as memory cells and select transistors on the epitaxial silicon layer 16, formed on the insulating film 21. Moreover, a wiring step and the like are carried out to complete a semiconductor device such as LSI.

As described above, in the present variation, the side surfaces of the floating gate electrode film (polysilicon film) 42 are covered with the sidewall mask 45. Consequently, when the epitaxial SiGe layer 15 is etched, the floating gate electrode film (polysilicon film) 42 can be reliably prevented from being etched.

The variations described in the first embodiment are applicable to the second embodiment, described above.

Furthermore, in the first and second embodiments, described above, instead of the epitaxial SiGe layer 15, another epitaxial semiconductor layer may be used. That is, an epitaxial semiconductor layer can be used which can be epitaxially grown on the silicon substrate 11 and which can be selectively etched with respect to the silicon substrate 11. For example, an epitaxial silicon layer containing a high concentration of impurities such as phosphorous (P) or boron (B) can be used instead of the epitaxial SiGe layer 15.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, the method comprising:
    removing a part of a semiconductor substrate to form a protruding portion and a recess portion in a surface area of the semiconductor substrate;
    forming a first epitaxial semiconductor layer in the recess portion of the semiconductor substrate;
    forming a second epitaxial semiconductor layer directly on the protruding portion of the semiconductor substrate and on the first epitaxial semiconductor layer, the second epitaxial semiconductor layer being physically in contact with the protruding portion of the semiconductor substrate;
    removing a first part of the second epitaxial semiconductor layer with a second part of the second epitaxial semiconductor layer left to expose a part of the first epitaxial semiconductor layer; and
    etching the first epitaxial semiconductor layer from the exposed part of the first epitaxial semiconductor layer to form a cavity under the second part of the second epitaxial semiconductor layer.

2. The method according to claim 1, wherein the recess portion and the protruding portion are formed in the surface area of the semiconductor substrate by removing the part of the semiconductor substrate using a mask pattern formed on the semiconductor substrate as a mask, and
    the protruding portion is protected by the mask pattern when the first epitaxial semiconductor layer is formed in the recess portion.

3. The method according to claim 2, wherein width of the protruding portion is smaller than that of the mask pattern.

4. The method according to claim 1, wherein height of a top surface of the first epitaxial semiconductor layer formed in the recess portion is substantially the same as that of a top surface of the protruding portion.

5. The method according to claim 4, wherein the second epitaxial semiconductor layer having substantially the same thickness is formed on the protruding portion and the first epitaxial semiconductor layer.

6. The method according to claim 1, wherein the first part of the second epitaxial semiconductor layer is removed with the second part left to form a trench.

7. The method according to claim 6, wherein a direction in which the trench extends is perpendicular to a direction in which the recess portion and the protruding portion extend.

8. The method according to claim 6, further comprising forming an insulating film in the trench and the cavity.

9. The method according to claim 1, wherein when the first part of the second epitaxial semiconductor layer is removed, that part of the first epitaxial semiconductor layer which is positioned under the first part is removed.

10. The method according to claim 1, further comprising forming an insulating film in the cavity.

11. The method according to claim 10, wherein the insulating film is formed in the entire cavity.

12. The method according to claim 10, wherein the insulating film is formed along inner surfaces of the cavity.

13. The method according to claim 10, wherein the insulating film is formed by an anisotropic film forming method.

14. The method according to claim 1, wherein forming the first epitaxial semiconductor layer includes:
    forming a first SiGe layer having a first Ge concentration;
    forming a second SiGe layer on the first SiGe layer, the second SiGe layer having a second Ge concentration higher than the first Ge concentration; and
    forming a third SiGe layer on the second SiGe layer, the third SiGe layer having a third Ge concentration lower than the second Ge concentration.

15. The method according to claim 1, wherein when the first epitaxial semiconductor layer is formed in the recess portion, a top surface and side surfaces of the protruding portion are protected by a predetermined film.

16. The method according to claim 1, further comprising:
    forming a gate insulating film on the second epitaxial semiconductor layer; and
    forming a gate electrode film on the gate insulating film,
    wherein when the first part of the second epitaxial semiconductor layer is removed, those parts of the gate insulating film and the gate electrode film which are formed over the first part are removed.

17. The method according to claim 16, wherein the gate insulating film is used as a tunnel insulating film in a memory cell transistor in a nonvolatile semiconductor memory device, and
    the gate electrode film is used as a floating gate electrode film in the memory cell transistor.

18. The method according to claim 16, wherein when the first part of the second epitaxial semiconductor layer is removed, a trench is formed by removing those parts of the gate insulating film and the gate electrode film which are formed over the first part and that part of the first epitaxial semiconductor layer which is formed under the first part.

19. The method according to claim 18, further comprising:
    forming a sidewall mask on side surfaces of the trench,
    wherein when the first epitaxial semiconductor layer is etched to form the cavity under the second part of the second epitaxial semiconductor layer, the side surfaces of the trench are protected by the sidewall mask.

20. The method according to claim 1, wherein the semiconductor substrate is formed of silicon,
    the first epitaxial semiconductor layer is formed of SiGe, and
    the second epitaxial semiconductor layer is formed of silicon.

* * * * *